US006304036B1

(12) United States Patent
Freeman et al.

(10) Patent No.: US 6,304,036 B1
(45) Date of Patent: Oct. 16, 2001

(54) SYSTEM AND METHOD FOR INITIATING PLASMA PRODUCTION

(75) Inventors: Richard L. Freeman, Del Mar; Robert L. Miller, San Diego, both of CA (US)

(73) Assignee: Archimedes Technology Group, Inc., San Diego, CA (US)

( * ) Notice: Subject to any disclaimer, the term of this patent is extended or adjusted under 35 U.S.C. 154(b) by 0 days.

(21) Appl. No.: 09/634,926

(22) Filed: Aug. 8, 2000

(51) Int. Cl.[7] ........................................... H05H 1/46
(52) U.S. Cl. ................... 315/111.51; 315/111.21; 315/111.41
(58) Field of Search .................. 315/111.51, 111.21, 315/111.41, 111.81; 343/745, 895; 455/91, 120, 129

(56) References Cited

U.S. PATENT DOCUMENTS

| 3,722,677 | 3/1973 | Lehnert ........................... 209/12.1 |
| 4,431,901 | 2/1984 | Hull .............................. 219/121.52 |
| 4,849,675 | 7/1989 | Muller ........................... 315/111.81 |
| 4,990,229 | 2/1991 | Campbell et al. ............... 315/111.41 |
| 5,039,312 | 8/1991 | Hollis, Jr. ........................... 95/28 |
| 5,146,137 | 9/1992 | Gesche et al. ................... 315/111.21 |
| 5,560,844 | 10/1996 | Boulos ........................... 219/121.59 |
| 5,681,434 | 10/1997 | Eastlund ............................ 204/156 |
| 6,060,837 | 5/2000 | Richardson et al. ............ 315/111.51 |
| 6,068,784 | 5/2000 | Collins et al. ........................ 216/68 |
| 6,096,220 | 8/2000 | Ohkawa ............................ 210/695 |
| 6,169,520 | 1/2001 | Anderson .......................... 343/701 |
| 6,217,776 | 4/2001 | Ohkawa ............................ 210/695 |
| 6,228,229 | 5/2001 | Raaijmakers et al. .......... 204/192.12 |
| 6,235,202 | 5/2001 | Ohkawa ............................ 210/695 |

Primary Examiner—Don Wong
Assistant Examiner—Thuy Vinh Tran
(74) Attorney, Agent, or Firm—Nydegger & Associates

(57) ABSTRACT

A system and method for initiating and maintaining a plasma in a chamber, in accordance with the helicon dispersion relation, requires an antenna for radiating RF energy into the chamber. An interferometer, or some similar device, is used in the system to monitor the plasma density level in the chamber, as the plasma is being produced. The plasma density level is then used to control the variable characteristics of the RF energy in accordance with the helicon dispersion relation.

21 Claims, 1 Drawing Sheet

SYSTEM AND METHOD FOR INITIATING PLASMA PRODUCTION

FIELD OF THE INVENTION

The present invention pertains generally to plasma generators. More particularly, the present invention pertains to systems and methods that use helicon waves to generate plasmas. The present invention is particularly, but not exclusively, useful as a system and method for varying the parameters of a helicon wave to conform with changes in the density of a plasma in a manner that facilitates the initiation and maintenance of the plasma.

BACKGROUND OF THE INVENTION

It is well known that a plasma containing free electrons and positive ions can be generated by heating vapor particles with RF energy. To do this, it is necessary to establish the proper conditions wherein the RF energy will effectively heat free electrons to ionize vapor particles, thus creating a plasma. One known way by which the transition from a vapor to a plasma can be effected is by radiating the vapor with a helicon wave in accordance with the so-called "helicon dispersion relation." Typically, this is accomplished in a cylindrical shaped vacuum chamber wherein a uniform magnetic field has been established and oriented substantially parallel to the longitudinal axis of the chamber. The mathematical expression for the helicon dispersion relation in this case is:

$$k_\| k = \omega_{pe}^2 \omega / \omega_{ce} c^2 = e n_e \mu_o \omega / B$$

wherein $\omega_{ci} < \omega < \omega_{pe}, \omega_{ce}$ k is the magnitude of the wave vector for the helicon wave;

$k_\|$ is a component of the wave vector that is parallel to the magnetic field inside the chamber;

e is the electron charge;

$\omega_{pe}$ is the electron plasma frequency;

$\omega$ is the angular frequency of the RF energy;

$\omega_{ce}$ is the electron cyclotron frequency;

$\omega_{ci}$ is the ion cyclotron frequency;

c is the speed of light;

$n_e$ is the electron density of the plasma in the chamber;

$\mu_o$ is the permeability of free space; and

B is the magnitude of the magnetic field in the chamber.

It is to be appreciated that, while the helicon dispersion relation set forth above may imply there is but a single $k_\|$, in reality, an antenna will generate many $k_{s1}$ components. Accordingly, the condition lends itself to a Fourier analysis. For purposes of this disclosure, however, it is deemed sufficient to consider only an optimal $k_\|$ component and thereby forgo an in-depth Fourier analysis.

Heretofore, in accordance with the helicon dispersion relation, plasma generators have been designed and manufactured using the specific structural parameters that are required for a particular operating condition. This has meant that the antenna for generating the RF energy, as well as other components of the system, have had to be specifically designed. In this design process, additional factors, such as the type of plasma to be produced, the size of the chamber, and the desired density of the plasma inside the chamber, have had to be considered. Further, it has often been necessary to pre-ionize a portion of the vapor in order to initiate the operation. It happens, however, that it may be desirable in some operations to be able to sequentially generate different types of plasmas using the same chamber. Also, for operational efficiencies, it may be desirable to have the ability to initiate a plasma generating operation from a zero plasma condition.

With the above in mind, it is helpful to review the helicon dispersion relation and identify effective operational variables that can be manipulated to satisfy the relation. Specifically, from the relation it is to be noted that:

$$k_\| k = e n_e \mu_o \omega / B,$$

and that $$\omega_{pe}^2 \omega / \omega_{ce} c^2 = e n_e \mu_o \omega / B.$$

Accordingly, as can be easily seen from the above expressions, $k_\| k$ is proportional to $n_e$. Similarly, $\omega$ is also proportional to $n_e$. It then follows that as the electron density of a plasma ($n_e$) changes (e.g. during an initial start up operation) the helicon dispersion relation can be maintained to continue the production of plasma by making appropriate changes in either $k_\| k$ or $\omega$.

In light of the above, it is an object of the present invention to provide a system and method for initiating and maintaining plasma production in a chamber which is operationally robust and effective over a range of electron densities. Another object of the present invention is to provide a system and method for initiating and maintaining plasma production in a chamber which is effective for producing different types of plasmas in successive operations using the same plasma chamber. Still another object of the present invention is to provide a system and method for initiating and maintaining plasma production in a chamber that is simple to operate, relatively easy to manufacture and comparatively cost effective.

SUMMARY OF THE PREFERRED EMBODIMENTS

A system for initiating and maintaining plasma production in accordance with the present invention includes a substantially cylindrical chamber defining a longitudinal axis. Also included are magnetic coils that are positioned around the chamber to establish a uniform magnetic field inside the chamber. For the present invention this uniform magnetic field is oriented generally parallel to the axis. Additionally, the system includes a source for introducing vapor particles into the chamber.

An important aspect of the present invention is an antenna that is mounted on the chamber. As intended for the present invention, this antenna is used to radiate RF energy into the chamber in a way that will ionize the vapor particles and thereby create a plasma. Specifically, the plasma is to be created according to the helicon dispersion relation, which can be expressed as:

$$k_\| k = \omega_{pe}^2 \omega / \omega_{ce} c^2 = e n_e \mu_o \omega / B,$$

In addition to the above mentioned components, the system of the present invention also includes an interferometer, or some similar type device, for monitoring the electron density (i.e. plasma density level) inside the chamber. According to the monitored plasma density level, a controller is then used to vary the frequency phase, or power level of the RF energy that is radiated by the antenna. Stated differently, these selected parameters of the RF energy are controlled to maintain a match for the helicon dispersion relation. Specifically, with density level ($n_e$) changes in the plasma, the RF energy also needs to somehow be changed in order to establish a match for the helicon dispersion relation. As mentioned above, it happens that this can be done by varying either $k_\parallel k$ or $\omega$. Accordingly, the present invention alternatively contemplates two embodiments for the system.

In a first embodiment for the system of the present invention, the antenna is configured to vary the $k_\parallel$ component of the wave vector in the RF energy. As contemplated for the present invention, this is accomplished by using an antenna that comprises a plurality of individual antenna elements. Specifically, each of the antenna elements is a coil, or so-called "strap," that is positioned around the chamber. More specifically, the antenna elements are positioned around the chamber in a side-by-side relationship, with each element being next to at least one other such antenna element. In this juxtaposed relationship, the antenna elements are collectively oriented in planes that are substantially perpendicular to the longitudinal axis of the chamber. Further, they are each separately connected directly to the controller. With this connection, the controller is able to establish a phase differential between the respective antenna elements, and the controller can selectively vary this phase differential to control $k_\parallel$ in the helicon dispersion relation. Thus, the match for the helicon dispersion relation is maintained. It is to be noted that in this embodiment of the present invention, the angular frequency of the RF energy, $\omega$, will be held constant.

In a second embodiment for the system of the present invention, the antenna match is controlled by varying the angular frequency of the RF energy, $\omega$. For this embodiment, the antenna is configured as a single coil having a plurality of turns that surround the chamber. Like the individual antenna elements disclosed above for the first embodiment of the system, in this second embodiment, the turns of the coil are oriented in a helix, wherein any small segment of the coil is slightly inclined to a reference plane that is perpendicular to the longitudinal axis of the chamber. With this "helical" antenna configuration, the angular frequency of the RF energy, $\omega$, is varied to maintain the match for the helicon dispersion relation. Specifically, the helical pitch of the coil introduces a parallel wavelength differential, $\lambda_\parallel$. Importantly, $\lambda_\parallel$ is proportional to $k_\parallel$ (i.e. $k_\parallel = 2\pi/\lambda_\parallel$), and will be fixed despite changes in the angular frequency of the RF energy, $\omega$). Consequently, for this embodiment of the present invention, the helicon dispersion relation can be maintained simply by varying the angular frequency of the RF energy, $\omega$.

In both embodiments of the present invention it is appreciated that the plasma will contain particles having an ion cyclotron frequency $\omega_{ci}$ which is below the electron cyclotron frequency, $\omega_{ce}$. Further, the present invention contemplates that the angular frequency, $\omega$, is such that $\omega_{ci} < \omega < \omega_{ce}$.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
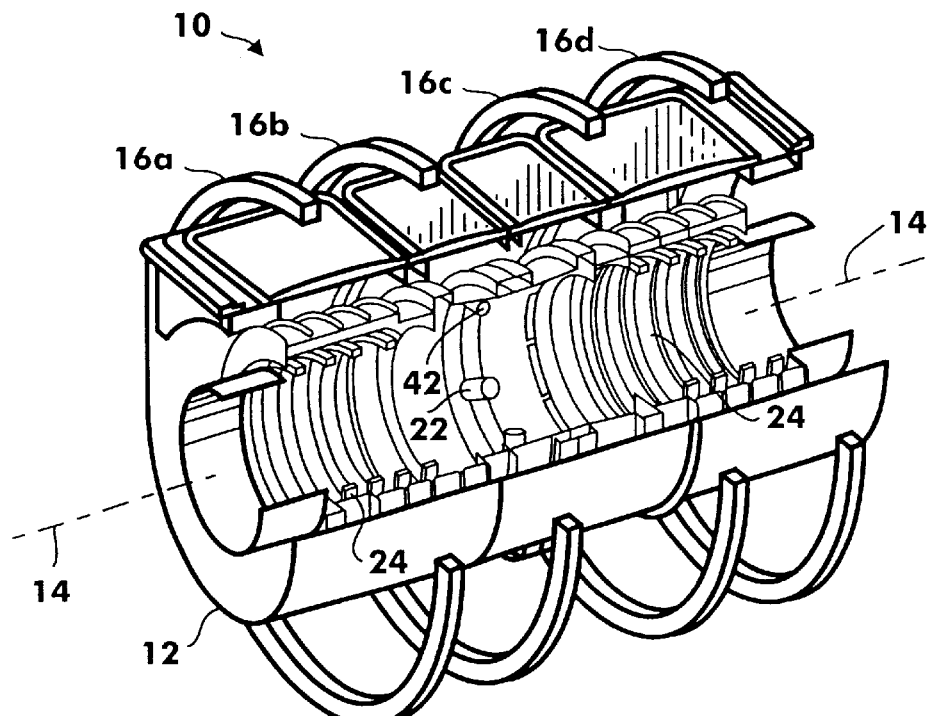
FIG. 1. is a perspective view of a plasma generator in accordance with the present invention with portions thereof removed for clarity.

Referring initially to FIG. 1, a system for producing plasmas in accordance with the present invention is shown and is generally designated 10. As shown, the system 10 includes a substantially cylindrical chamber 12 that defines a longitudinal axis 14. A plurality of magnetic coils 16 (of which the magnetic coils 16a, 16b, 16c and 16d and are only exemplary) are positioned around the chamber 12 for the purpose of generating a uniform magnetic field (B). For the present invention, the magnetic field is oriented in the chamber 12 substantially parallel to the longitudinal axis 14. In order to generate the charged particles (i.e. the plasma), the system 10 includes a vapor source 22 that is provided for the purpose of introducing vapors into the chamber 12.

It is well known that, under certain conditions, a plasma can be generated from vapors. For the present invention, the particular condition for causing such a transformation from vapor to plasma involves the creation of a helicon wave. Specifically, this condition is mathematically expressed by the helicon dispersion relation: $k_\parallel k = \omega_{pe}^2 \omega / \omega_{ce} c^2 = e n_e \mu_o \omega / B$.

As is also known by the skilled artisan, the helicon dispersion relation can be maintained in a vacuum vessel, such as the chamber 12, by radiating RF energy from an antenna 24. In particular, to create a plasma in the chamber 12, the antenna 24 radiates RF energy that interacts in the chamber 12 with vapors that are introduced from the vapor source 22. As intended for the present invention, the antenna 24 can have many different forms. Two specific configurations of these different forms are shown, respectively, in FIG. 2 and FIG. 3.

Figure 2:
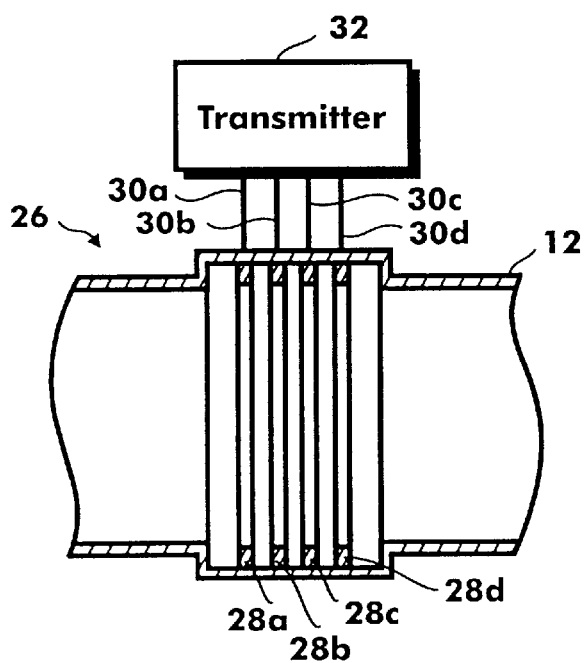
FIG. 2 is a schematic illustration of a cross sectional view of an antenna that is suitable for use with the present invention.

In FIG. 2, a first embodiment of the antenna 24 is shown and is generally designated 26. As shown, the first embodiment 26 of the antenna 24 includes a plurality of individual antenna elements 28a–d. For the present invention, these antenna elements 28a–d (so-called straps) are generally circular, and they are individually oriented in different parallel planes that are all substantially perpendicular to the longitudinal axis 14. Importantly, each of the antenna elements 28a–d is connected to an RF power transmitter 32 via a respective dedicated line 30a–d. As contemplated for the present invention, the transmitter 32 can be a variable power, variable frequency, variable phase transmitter of a type well known in the art. The transmitter 32 can be used for any antenna form disclosed herein.

Figure 3:
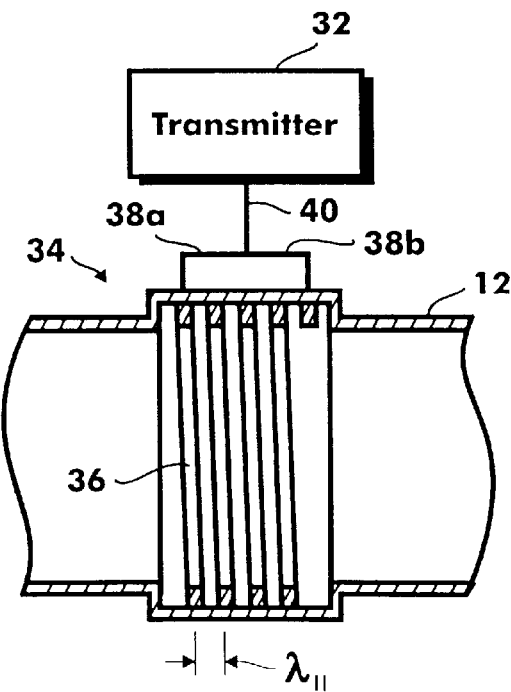
FIG. 3 is a schematic illustration of a cross sectional view of an alternate embodiment for an antenna that is suitable for use with the present invention.

In FIG. 3, a second embodiment of the antenna 24 is shown and is generally designated 34. As shown, this second embodiment 34 of the antenna 24 includes a coil 36 that is helically wound around the longitudinal axis 14. The inclination of the turns in coil 36 will thereby establish distances between the turns, in a direction parallel to the longitudinal axis 14. FIG. 3 also shows that a lead 38a, from one end of the coil 36, and a lead 38b, from the other end of the coil 36, are joined with the transmitter 32 via a common line 40. The result of this is the creation of an RF frequency component $\lambda_\parallel$ whenever this antenna 24 is activated.

Returning to FIG. 1, it will be seen that the system 10 of the present invention also includes an interferometer 42 that is mounted on the chamber 12 to monitor the interior of the chamber 12. Specifically, the interferometer 42 (or a similar type device that is well known in the pertinent art) is intended to monitor electron density ($n_e$) levels as a plasma is being generated inside the chamber 12. Signals indicative of the electron density ($n_e$) can then be sent from the interferometer 42 to the transmitter 32. The transmitter 32 will then appropriately activate the antenna 24 (either the first embodiment 26 or second embodiment 34) to satisfy the helicon dispersion relation.

For an operation of the system 10 using the first embodiment 26 of the antenna 24, as mentioned above, the helicon dispersion relation is satisfied and maintained by controlling the wave vector component $k_\parallel$. This is done by establishing phase differentials between the various antenna elements 28a–d. Specifically, while the angular frequency of the RF energy, $\omega$, is the same for each antenna element 28, the phase of the RF energy for each antenna element (e.g. antenna element 28a) is different from the phases of the other antenna elements (e.g. 28b, 28c and 28d). This applies for each antenna element 28. Thus, for example, the phase of the RF energy for antenna element 28b is different from the phases of the other antenna elements (e.g. 28a, 28c and 28d). As intended for the present invention, such phase differentials will be selectively established to control the wave vector component $k_\parallel$. In this manner, as the plasma density level in chamber 12 changes (indicated by changes in $n_e$) the transmitter 32 will vary the phase differentials between the antenna elements 28a–d to maintain the helicon dispersion relation.

For an operation of the system 10 using the second embodiment 34 of the antenna 24, the helicon dispersion relation is satisfied and maintained by controlling the angular frequency of the RF energy, $\omega$ at the transmitter 32. In this case, the helical pitch of the coil 36 establishes a wavelength component, $\lambda_\parallel$, that is parallel to the longitudinal axis 14, and is proportional to $k_\parallel$ (i.e. $k_\parallel = 2\pi/\lambda_\parallel$). Therefore, the consequences of fixing $\lambda_\parallel$ while varying the frequency are the same as for the variations of $k_\parallel$ discussed above. Thus, in accordance with changes in the plasma density level in chamber 12 (indicated by changes in $n_e$), the transmitter 32 will vary the frequency on coil 36 to maintain the helicon dispersion relation.

Regardless which configuration for antenna 24 that is used for the system 10 of the present invention, it is an important aspect of the system 10 that the plasma can be generated by starting from an initial zero plasma condition. Further, as mentioned above, although the disclosure above has considered only one, albeit variable, $k_\parallel$ and $\lambda_\parallel$, it will be appreciated that there is in reality a bandwidth of $k_\parallel$ and a bandwidth of $\lambda_\parallel$ for each condition. The consequence here is that variations made by the transmitter 32 to maintain $k_\parallel$ and $\lambda_\parallel$ will extend over a finite bandwidth.

While the particular System and Method for Initiating Plasma Production as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A system for initiating and maintaining plasma production which comprises:
    a chamber;
    a source for introducing a vapor into said chamber;
    an antenna mounted on said chamber, said antenna radiating RF energy into said chamber for ionizing the vapor in said chamber to create a plasma according to a helicon dispersion relation expressed as $k_\parallel k = \omega_{pe}^2 \omega / \omega_{ce} c^2 = e n_e \mu_o \omega / B$ for the case when $\omega_{ci} < \omega < \omega_{pe}$, $\omega_{ce}$, and wherein k is the magnitude of the wave vector for the helicon wave;
    $k_\parallel$ is a component of the wave vector that is parallel to the magnetic field inside the chamber;
    e is the electron charge;
    $\omega_{pe}$ is the electron plasma frequency;
    $\omega$ is the angular frequency of the RF energy;
    $\omega_{ce}$ is the electron cyclotron frequency;
    $\omega_{ci}$ is the ion cyclotron frequency;
    c is the speed of light;
    $n_e$ is the electron density of the plasma in the chamber;
    $\mu_o$ is the permeability of free space;
    B is the magnitude of the magnetic field in the chamber; and
    a variable power, variable frequency, variable phase transmitter for delivering rf power to said antenna to maintain a match for the helicon dispersion relation.

2. A system as recited in claim 1 wherein said antenna comprises a plurality of individual antenna elements.

3. A system as recited in claim 2 wherein said transmitter is connected to said antenna to establish a phase differential between respective said antenna elements.

4. A system as recited in claim 3 wherein said transmitter varies said phase differential between said antenna elements to control $k_\parallel$ in the helicon dispersion relation to maintain the match for the helicon dispersion relation.

5. A system as recited in claim 4 wherein the angular frequency of the RF energy, $\omega$, is held constant.

6. A system as recited in claim 1 wherein said antenna is a coil having a plurality of turns.

7. A system as recited in claim 6 wherein the angular frequency of the RF energy, $\omega$, is varied to maintain the match for the helicon dispersion relation.

8. A system as recited in claim 1 further comprising an interferometer for monitoring plasma density levels in said chamber, and wherein the RF energy radiated by said antenna is varied according to said plasma density levels to maintain the match for the helicon dispersion relation.

9. A system as recited in claim 1 wherein the plasma contains particles having an ion cyclotron frequency $\omega_{ci}$ with $\omega_{ci} < \omega < \omega_{ce}$.

10. A system for initiating and maintaining plasma production in a chamber which comprises:
    a means for generating a plasma in said chamber using RF energy, said RF energy having a variable characteristic;
    a means for monitoring a plasma density level in said chamber;
    a means for using said plasma density level to generate a control signal; and
    a means for changing said variable characteristic to substantially maintain said control signal at a null.

11. A system as recited in claim 10 wherein said RF energy generating means is an antenna.

12. A system as recited in claim 11 wherein said generating means is an antenna comprising a plurality of individual antenna elements, and wherein said variable characteristic is a phase differential established between respective said antenna elements.

13. A system as recited in claim 10 wherein said generating means is an antenna comprising a coil having a plurality of turns, and wherein said variable characteristic is the angular frequency of the RF energy, $\omega$.

14. A system as recited in claim 13 wherein said monitoring means is an interferometer.

15. A system as recited in claim 10 wherein said control signal is generated according to a helicon dispersion relation expressed as $k_\parallel k = \omega_{pe}^2 \omega / \omega_{ce} c^2 = e n_e \mu_o \omega / B$ wherein $\omega_{ci} < \omega < \omega_{pe}, \omega_{ce}$ k is the magnitude of the wave vector for the helicon wave;

$k_{\parallel}$ is a component of the wave vector that is parallel to the magnetic field inside the chamber;

e is the electron charge;

$\omega_{pe}$ is the electron plasma frequency;

$\omega$ is the angular frequency of the RF energy;

$\omega_{ce}$ is the electron cyclotron frequency;

$\omega_{ci}$ is the ion cyclotron frequency;

c is the speed of light;

$n_e$ is the electron density of the plasma in the chamber;

$\mu_o$ is the permeability of free space; and

B is the magnitude of the magnetic field in the chamber.

16. A system as recited in claim 15 wherein said variable characteristic is an electrical phase.

17. A system as recited in claim 15 wherein said variable characteristic is $\omega$.

18. A system as recited in claim 15 wherein said variable characteristic is power.

19. A method for initiating and maintaining plasma production in a chamber which comprises the steps of:

generating a plasma in said chamber using RF energy, said RF energy having a variable characteristic;

monitoring a plasma density level in said chamber;

using said plasma density level to control said variable characteristic of said RF energy with a control signal; and changing said variable characteristic of said RF energy to substantially maintain said control signal at a null.

20. A method as recited in claim 19 wherein said RF energy is generated with an antenna comprising a plurality of individual antenna elements, and wherein said variable characteristic is a phase differential established between respective said antenna elements.

21. A method as recited in claim 19 wherein said RF energy is generated with an antenna comprising a coil having a plurality of turns, and wherein said variable characteristic is the angular frequency of the RF energy, $\omega$.

* * * * *

UNITED STATES PATENT AND TRADEMARK OFFICE
CERTIFICATE OF CORRECTION

PATENT NO. : 6,304,036 B1
DATED : October 16, 2001
INVENTOR(S) : Richard L. Freeman, Robert L. Miller It is certified that error appears in the above-identified patent and that said Letters Patent is hereby corrected as shown below:

Column 1,
Line 52, delete [ $k_{81}$ ] insert -- $k_{\|}$ --
Line 55, delete [ $k_{\|}$component ] insert -- $k_{\|}$ component --

Column 3,
Line 25, delete [ $k_{\|}$in ] insert -- $k_{\|}$ in --
Line 45, delete [ $\omega$). ] insert -- $\omega$. --

Signed and Sealed this

Twenty-sixth Day of March, 2002

Attest:

JAMES E. ROGAN
*Attesting Officer*    *Director of the United States Patent and Trademark Office*